(12) United States Patent
Nakayama et al.

(10) Patent No.: US 8,634,238 B2
(45) Date of Patent: Jan. 21, 2014

(54) MAGNETIC MEMORY ELEMENT HAVING AN ADJUSTMENT LAYER FOR REDUCING A LEAKAGE MAGNETIC FIELD FROM A REFERENCE LAYER AND MAGNETIC MEMORY THEREOF

(75) Inventors: Masahiko Nakayama, Shimonoseki (JP); Hisanori Aikawa, Yokohama (JP); Masaru Toko, Yokohama (JP); Hiroaki Yoda, Kawasaki (JP); Tatsuya Kishi, Yokohama (JP); Sumio Ikegawa, Tokyo (JP)

(73) Assignee: Kabushiki Kaisha Toshiba, Tokyo, (JP)

( * ) Notice: Subject to any disclaimer, the term of this patent is extended or adjusted under 35 U.S.C. 154(b) by 0 days.

(21) Appl. No.: 13/604,386

(22) Filed: Sep. 5, 2012

(65) Prior Publication Data

US 2013/0099337 A1 Apr. 25, 2013

(30) Foreign Application Priority Data

Oct. 21, 2011 (JP) .................................. 2011-231363

(51) Int. Cl.
*G11C 11/15* (2006.01)
(52) U.S. Cl.
USPC ............ 365/173; 365/171; 365/158; 365/148

(58) Field of Classification Search
USPC .......................... 365/158, 148, 163, 173, 171
See application file for complete search history.

(56) References Cited

U.S. PATENT DOCUMENTS

| | | | |
|---|---|---|---|
| 6,285,581 B1 * | 9/2001 | Tehrani et al. ................ | 365/173 |
| 7,889,543 B2 | 2/2011 | Morise et al. | |
| 8,169,817 B2 | 5/2012 | Nakayama et al. | |

FOREIGN PATENT DOCUMENTS

| | | |
|---|---|---|
| JP | 2003-110165 A | 4/2003 |
| JP | 2009-093787 A | 4/2009 |
| JP | 2009-200216 A | 9/2009 |
| JP | 2010-080746 A | 4/2010 |
| JP | 2010-219412 A | 9/2010 |

\* cited by examiner

*Primary Examiner* — Andrew Q Tran
(74) *Attorney, Agent, or Firm* — Knobbe, Martens, Olson & Bear LLP

(57) ABSTRACT

According to one embodiment, a magnetic memory element includes a memory layer, a first nonmagnetic layer, a reference layer, a second nonmagnetic layer, and an adjustment layer which are stacked. The adjustment layer is configured to reduce a leakage magnetic field from the reference layer. The adjustment layer is formed by stacking an interface layer provided on the second nonmagnetic layer, and a magnetic layer having magnetic anisotropy perpendicular to a film surface. Saturation magnetization of the interface layer is larger than that of the magnetic layer.

16 Claims, 3 Drawing Sheets

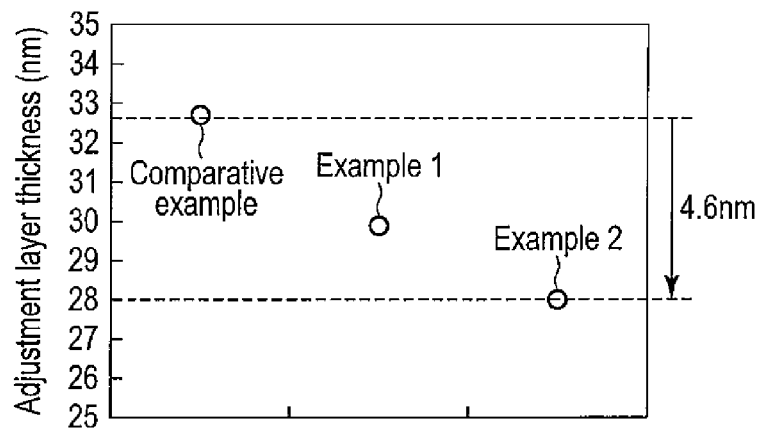
F I G. 3
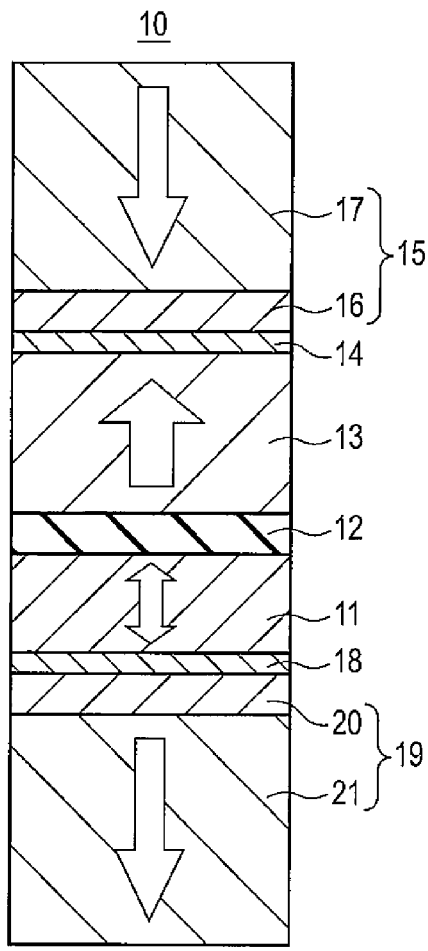
F I G. 4

US 8,634,238 B2

MAGNETIC MEMORY ELEMENT HAVING AN ADJUSTMENT LAYER FOR REDUCING A LEAKAGE MAGNETIC FIELD FROM A REFERENCE LAYER AND MAGNETIC MEMORY THEREOF

CROSS-REFERENCE TO RELATED APPLICATIONS

This application is based upon and claims the benefit of priority from Japanese Patent Application No. 2011-231363, filed Oct. 21, 2011, the entire contents of which are incorporated herein by reference.

FIELD

Embodiments described herein relate generally to a magnetic memory element and magnetic memory.

BACKGROUND

A magnetic random access memory (MRAM) uses, as a memory element, an MTJ (Magnetic Tunnel Junction) element using the magnetoresistive effect by which a resistance value changes in accordance with the direction of magnetization. The MTJ element has a three-layered structure including a reference layer, a memory layer, and an insulating layer that is sandwiched between the reference layer and memory layer and forms a tunnel barrier. The magnetization in the reference layer is fixed in one direction and does not reverse even when a write operation is performed. On the other hand, the magnetization in the memory layer reverses due to torque externally given by a write operation.

An MRAM using a spin-transfer torque writing method of writing data by directly supplying a current to the MTJ element is known. When a write current is supplied to the MTJ element, the resistance value of the MTJ element changes depending on the relative directions of magnetization in the two magnetic layers. That is, the resistance value of the MTJ element becomes low when the magnetization directions in the memory layer and reference layer are parallel, and becomes high when the magnetization directions are antiparallel. The MTJ element can be used as a memory element by making these low- and high-resistance states of the MTJ element correspond to binary data.

Generally, a magnetic layer having magnetic anisotropic energy higher than that of the memory layer is used as the reference layer, so a leakage magnetic field from the reference layer is large. Therefore, the leakage magnetic field from the reference layer acts on the memory layer, and the magnetic coercive force of the memory layer shifts. Consequently, a current for switching the magnetization in the memory layer increases, or the thermal stability of the MTJ element decreases. Also, as the micropatterning of the MTJ element advances, the leakage magnetic field from the reference layer increases. As a consequence, the magnetic coercive force of the memory layer largely shifts.

BRIEF DESCRIPTION OF THE DRAWINGS

FIG. 3 is a view for explaining the effect of reducing the thickness of an adjustment layer;

FIG. 4 is a sectional view showing the arrangement of an MTJ element according to the second embodiment.

DETAILED DESCRIPTION

Figure 1:
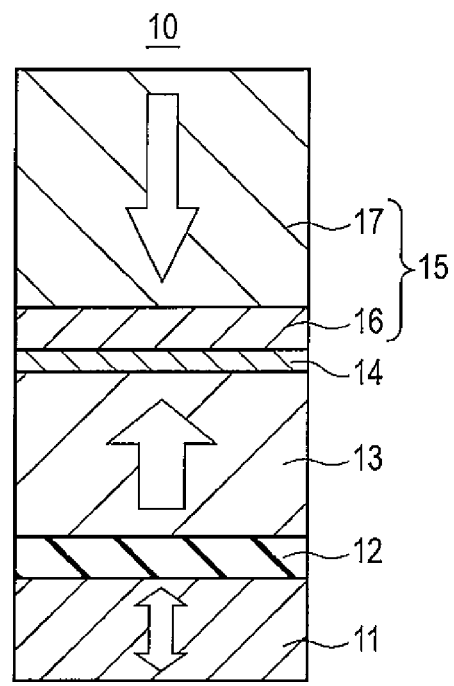
FIG. 1 is a sectional view showing the arrangement of an MTJ element according to the first embodiment.

In general, according to one embodiment, there is provided a magnetic memory element comprising:
a memory layer having magnetic anisotropy perpendicular to a film surface and having a variable magnetization direction;
a first nonmagnetic layer provided on the memory layer;
a reference layer provided on the first nonmagnetic layer, having magnetic anisotropy perpendicular to a film surface, and having an invariable magnetization direction;
a second nonmagnetic layer provided on the reference layer; and
an adjustment layer provided on the second nonmagnetic layer and configured to reduce a leakage magnetic field from the reference layer,
wherein the adjustment layer is formed by stacking an interface layer provided on the second nonmagnetic layer, and a magnetic layer having magnetic anisotropy perpendicular to a film surface, and
saturation magnetization of the interface layer is larger than that of the magnetic layer.

The embodiments will be described hereinafter with reference to the accompanying drawings. In the description which follows, the same or functionally equivalent elements are denoted by the same reference numerals, to thereby simplify the description.

[First Embodiment]
FIG. 1 is a sectional view showing the arrangement of an MTJ element 10 as a magnetic memory element according to the first embodiment. The MTJ element 10 is formed by stacking a memory layer 11, nonmagnetic layer (tunnel barrier layer) 12, reference layer 13, nonmagnetic layer (spacer layer) 14, and adjustment layer 15 in this order from below. Note that the stacking order shown in FIG. 1 may also be reversed. The arrows in FIG. 1 represent magnetization.

Each of the memory layer 11 and reference layer 13 is made of a ferromagnetic material, has magnetic anisotropy in a direction perpendicular to the film surfaces, and has a direction of easy magnetization perpendicular to the film surfaces. That is, the MTJ element 10 is a so-called perpendicular magnetization type MTJ element in which the magnetization directions in the memory layer 11 and reference layer 13 are perpendicular to the film surfaces.

In the memory layer 11, the magnetization direction is variable (reverses). In the reference layer 13, the magnetization direction is invariable (fixed). The reference layer 13 is so set as to have perpendicular magnetic anisotropic energy much higher than that of the memory layer 11. The magnetic anisotropy can be set by adjusting the material configuration and/or thickness. Thus, the magnetization switching current of the memory layer 11 is decreased, thereby making the magnetization switching current of the reference layer 13 larger than that of the memory layer 11. This makes it possible to implement the MTJ element 10 including the memory layer 11 having a variable magnetization direction and the reference layer 13 having an invariable magnetization direction, with respect to a predetermined write current.

As the nonmagnetic layer 12, it is possible to use, e.g., a nonmagnetic metal, nonmagnetic semiconductor, or insulator. The nonmagnetic layer 12 is called a tunnel barrier layer when an insulator is used. As the tunnel barrier layer 12, magnesium oxide (MgO) or the like is used.

This embodiment uses a spin-transfer torque writing method by which a write current is directly supplied to the MTJ element 10 and the magnetized state of the MTJ element 10 is controlled by using this write current. The MTJ element 10 can take one of a low-resistance state and high-resistance state in accordance with whether the relative magnetization directions in the memory layer 11 and reference layer 13 are parallel or antiparallel.

When a write current flowing from the memory layer 11 to the reference layer 13 is supplied to the MTJ element 10, the relative magnetization directions in the memory layer 11 and reference layer 13 become parallel. In this parallel state, the MTJ element 10 has the lowest resistance value and is set in the low-resistance state. The low-resistance state of the MTJ element 10 is defined as, e.g., data "0".

On the other hand, when a write current flowing from the reference layer 13 to the memory layer 11 is supplied to the MTJ element 10, the relative magnetization directions in the memory layer 11 and reference layer 13 become antiparallel. In this antiparallel state, the MTJ element 10 has the highest resistance value and is set in the high-resistance state. The high-resistance state of the MTJ element 10 is defined as, e.g., data "1".

Thus, the MTJ element 10 can be used as a memory element capable of storing one-bit data (binary data). It is possible to freely set the allocation between the resistance states of the MTJ element 10 and data.

When reading out data from the MTJ element 10, a read voltage is applied to the MTJ element 10, and the resistance value of the MTJ element 10 is detected based on the read current flowing through the MTJ element 10 in this state. The read voltage is set at a value much smaller than the threshold value of magnetization reversal caused by spin-transfer torque.

Figure 2:
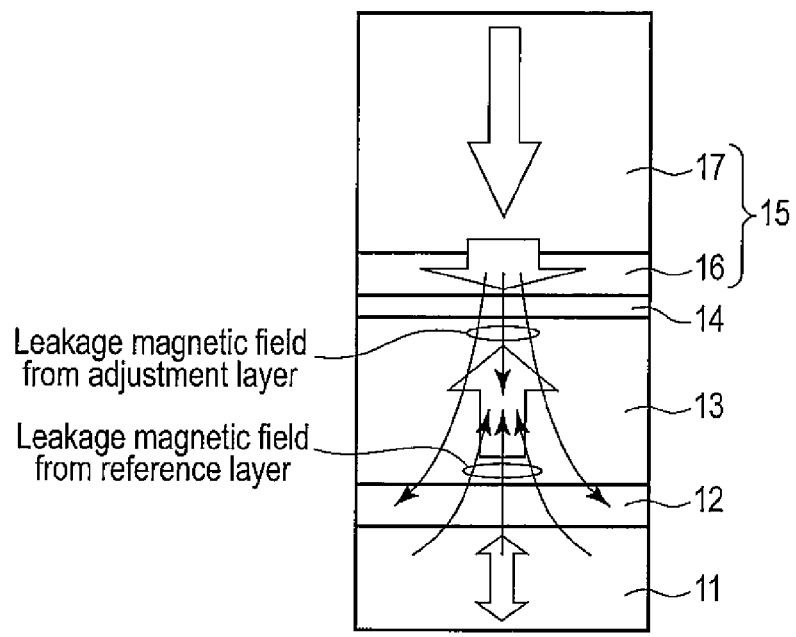
FIG. 2 is an exemplary view for explaining leakage magnetic fields in the MTJ element.

FIG. 2 is an exemplary view for explaining leakage magnetic fields in the MTJ element 10. The memory layer 11 and reference layer 13 forming the MTJ element 10 are made of magnetic materials and hence generate magnetic fields outside. In the perpendicular magnetization type MTJ element, a leakage magnetic field generated from the reference layer 13 is generally larger than that in an in-plane magnetization type element. Also, the memory layer 11 having a magnetic coercive force smaller than that of the reference layer 13 is strongly affected by the leakage magnetic field from the reference layer 13. More specifically, the coercive magnetic force (or magnetization curve) of the memory layer 11 shifts under the influence of the leakage magnetic field from the reference layer 13, thereby increasing the magnetization switching current and/or decreasing the thermal stability. The adjustment layer 15 of this embodiment is formed to reduce the leakage magnetic field applied from the reference layer 13 to the memory layer 11.

The adjustment layer 15 has a multilayered structure in which an interface layer 16 formed on the nonmagnetic layer 14 and a magnetic layer 17 are stacked. The magnetic layer 17 is made of a ferromagnetic material, has magnetic anisotropy perpendicular to the film surfaces, and has a direction of easy magnetization perpendicular to the film surfaces. Like the reference layer 13, the magnetic layer 17 has an invariable magnetization direction. The magnetic layer 17 antiferromagnetically couples with the reference layer 13, and the magnetization directions in the magnetic layer 17 and reference layer 13 are set antiparallel. The interface layer 16 is made of a ferromagnetic material. The saturation magnetization of the interface layer 16 is set larger than that of the magnetic layer 17. The interface layer 16 itself need not have magnetic anisotropy perpendicular to the film surfaces; the magnetization in the interface layer 16 need only be set perpendicular to the film surfaces by exchange coupling with the magnetic layer 17. As a consequence, the adjustment layer 15 can have magnetization perpendicular to the film surfaces as a whole.

The spacer layer 14 is formed to prevent ferromagnetic coupling between the adjustment layer 15 and reference layer 13. The spacer layer 14 has a heat resistance that prevents mixing of the adjustment layer 15 and reference layer 13 in a heating step, and also has a function of controlling the crystal orientation when forming the adjustment layer 15. As the spacer layer 14, it is possible to use a nonmagnetic metal such as ruthenium (Ru), platinum (Pt), silver (Ag), or copper (Cu).

Magnetic materials meeting the saturation magnetization conditions of the interface layer 16 and magnetic layer 17 will be explained below.

The interface layer 16 is made of one element selected from the group consisting of cobalt (Co), iron (Fe), and nickel (Ni), or an alloy containing at least one element selected from the group consisting of cobalt (Co), iron (Fe), and nickel (Ni). The interface layer 16 made of this material has magnetic anisotropy in the in-plane direction when no external magnetic field is applied, and has a direction of easy magnetization in the in-plane direction.

The magnetic layer 17 is made of an alloy containing at least one element selected from the group consisting of cobalt (Co) and iron (Fe), and at least one element selected from the group consisting of platinum (Pt), palladium (Pd), and chromium (Cr). Also, the magnetic layer 17 is formed by alternately stacking an alloy containing at least one element selected from the group consisting of cobalt (Co) and iron (Fe), and an alloy containing at least one element selected from the group consisting of platinum (Pt), palladium (Pd), and chromium (Cr).

Generally, the leakage magnetic field from the reference layer 13 increases when the MTJ element 10 is micropatterned. When the adjustment layer 15 is formed by a single magnetic layer, it is necessary to increase the thickness and/or saturation magnetization of the adjustment layer 15 in order to reduce the leakage magnetic field applied to the memory layer as micropatterning advances. If the thickness of the adjustment layer 15 is simply increased, however, the height of the MTJ element in the direction perpendicular to the film surfaces increases, and this makes micropatterning difficult. Also, if the saturation magnetization of the adjustment layer 15 is increased, the magnetic anisotropy generally decreases, and this makes the adjustment layer magnetically unstable.

On the other hand, when the adjustment layer 15 has the multilayered structure including the interface layer 16 and magnetic layer 17 as in this embodiment, it is possible to efficiently reduce the leakage magnetic field to be applied to the memory layer by forming the interface layer 16 having large saturation magnetization in a position close to the memory layer. Also, since it is unnecessary to forcedly raise the saturation magnetization of the magnetic layer 17, a material that maximizes the magnetic anisotropy can be used. That is, the functions are separated such that the interface layer 16 close to the memory layer adjusts the saturation magnetization of the adjustment layer 15, which greatly helps reduce the leakage magnetic field, thereby efficiently reducing the leakage magnetic field acting on the memory layer, and the magnetic layer 17 adjusts the magnetic stability of the adjustment layer 15. Even when the MTJ element 10 is micropatterned, therefore, it is possible to reduce the thickness of the whole adjustment layer 15 and at the same time reduce the leakage magnetic field to be applied to the memory layer. This is the feature of this embodiment.

EXAMPLES

FIG. 3 is a view for explaining the effect of reducing the thickness of the adjustment layer 15. The ordinate in FIG. 3 indicates the total thickness of the adjustment layer 15 including the interface layer 16.

In the MTJ element 10 of Example 1, cobalt (Co) having a thickness of about 1 nm and a saturation magnetization of about 1,400 emu/cc was used as the interface layer 16 of the adjustment layer 15, and a perpendicular magnetization film having a saturation magnetization of about 900 emu/cc was used as the magnetic layer 17 of the adjustment layer 15.

In the MTJ element 10 of Example 2, cobalt (Co) having a thickness of about 2 nm and a saturation magnetization of about 1,400 emu/cc was used as the interface layer 16 of the adjustment layer 15, and a perpendicular magnetization film having a saturation magnetization of about 900 emu/cc was used as the magnetic layer 17 of the adjustment layer 15.

FIG. 3 also shows a comparative example in which the adjustment layer 15 was a single layer made of the same material as that of the magnetic layer 17. The arrangements of the memory layer 11 and reference layer 13 were the same in Examples 1 and 2 and the comparative example. The memory layer 11 was, e.g., a perpendicular magnetization film having a thickness of about 2 nm and a saturation magnetization of about 800 emu/cc. The reference layer 13 was, e.g., a perpendicular magnetization film having a thickness of about 8.5 nm and a saturation magnetization of about 691 emu/cc. The diameter of the MTJ element 10 was about 41 nm.

As can be understood from FIG. 3, the thickness of the adjustment layer 15 of each of Examples 1 and 2 was smaller than that of the comparative example in which the adjustment layer 15 was a single perpendicular magnetic film. Also, the thickness of the adjustment layer 15 of Example 2 in which the thickness of the interface layer 16 was larger than that of Example 1 was smaller than that of Example 1, and smaller by about 4.6 nm than that of the comparative example.

(Effects)

In the first embodiment as described in detail above, the MTJ element 10 includes the adjustment layer 15 for reducing the leakage magnetic field from the reference layer 13, in addition to the memory layer 11 and reference layer 13 having magnetic anisotropy perpendicular to the film surfaces. The adjustment layer 15 is stacked on the spacer layer 14 on the reference layer 13, and the magnetization direction in the adjustment layer 15 is set antiparallel to that in the reference layer 13. Also, the adjustment layer 15 is formed by stacking the interface layer 16 formed on the spacer layer 14, and the magnetic layer 17 having magnetic anisotropy perpendicular to the film surfaces. The saturation magnetization of the interface layer 16 is set larger than that of the magnetic layer 17.

Accordingly, the first embodiment can prevent the leakage magnetic field of the reference layer 13 from acting on the memory layer 11, thereby preventing the shift of the magnetic coercive force of the memory layer 11. This makes it possible to reduce the magnetization switching current, and improve the thermal stability of the MTJ element 10.

Also, even when the MTJ element 10 is micropatterned, the increase in thickness of the adjustment layer 15 can be prevented. That is, the leakage magnetic field from the reference layer 13 can efficiently be reduced because the interface layer 16 having a large saturation magnetization is positioned close to the reference layer 13. This makes it possible to reduce the thickness of the adjustment layer 15 and at the same time prevent the shift of the magnetic coercive force of the memory layer 11.

Furthermore, since the thickness of the whole MTJ element 10 can be reduced, the processing of the MTJ element 10 is easy. Even when the MTJ element 10 is micropatterned, therefore, it is readily possible to process the MTJ element 10 into a pillar shape.

[Second Embodiment]

In the second embodiment, two adjustment layers are prepared to reduce a leakage magnetic field from a reference layer, and an MTJ element 10 is formed by sandwiching the reference layer and a memory layer between the two adjustment layers. FIG. 4 is a sectional view showing the arrangement of the MTJ element 10 according to the second embodiment.

A nonmagnetic layer (spacer layer) 18 is formed under a memory layer 11. The material of the spacer layer 18 is the same as that of the spacer layer 14 explained in the first embodiment.

An adjustment layer 19 for reducing a leakage magnetic field from a reference layer 13 is formed under the spacer layer 18. The adjustment layer 19 has a multilayered structure in which an interface layer 20 formed on the spacer layer 18 and a magnetic layer 21 are stacked. The magnetic layer 21 is made of a ferromagnetic material, has magnetic anisotropy perpendicular to the film surfaces, and has a direction of easy magnetization perpendicular to the film surfaces. Like the reference layer 13, the magnetic layer 21 has an invariable magnetization direction. The magnetization direction in the magnetic layer 21 is set antiparallel to that in the reference layer 13. The interface layer 20 is made of a ferromagnetic material and has saturation magnetization set larger than that of the magnetic layer 21. The adjustment layer 15 has magnetization perpendicular to the film surfaces as a whole due to the magnetization of the magnetic layer 21. The materials of the interface layer 20 and magnetic layer 21 are respectively the same as those of the interface layer 16 and magnetic layer 17 explained in the first embodiment.

The MTJ element 10 arranged as described above can further reduce the influence the leakage magnetic field from the reference layer 13 on the memory layer 11. This makes it possible to prevent the shift of the magnetic coercive force of the memory layer 11. Also, even when the MTJ element 10 is micropatterned, the increase in thickness of an adjustment layer 15 and the adjustment layer 19 can be prevented.

[Third Embodiment]

The third embodiment is a configuration example when an MRAM (magnetic memory) is formed by using an MTJ element 10 described above. As the MTJ element 10, either of the MTJ elements explained in the first and second embodiments can be used.

Figure 5:
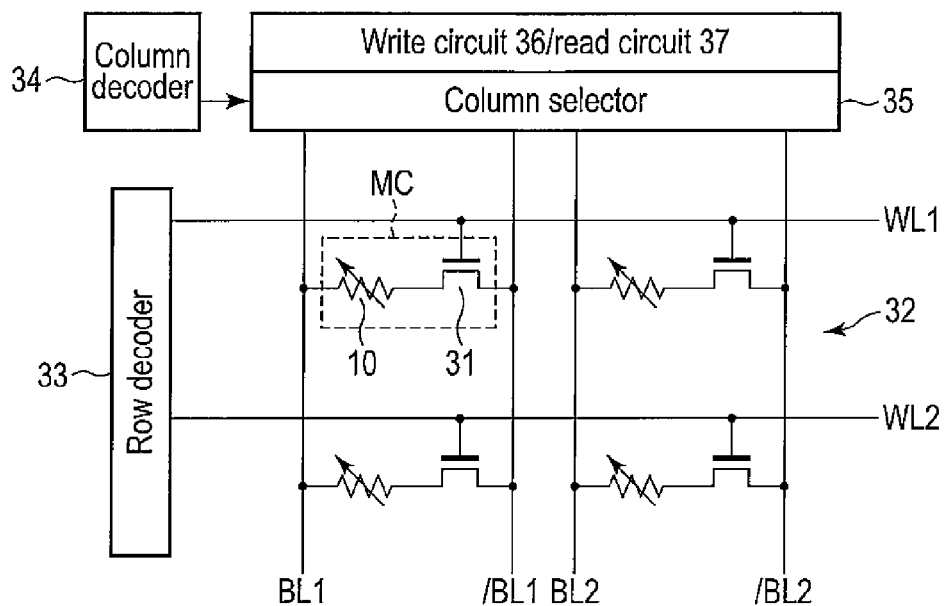
FIG. 5 is a circuit diagram showing the arrangement of an MRAM according to the third embodiment.

FIG. 5 is a circuit diagram showing the arrangement of an MRAM 30 according to the third embodiment. The MRAM 30 includes a memory cell array 32 including a plurality of memory cells MC arranged in a matrix. Note that FIG. 5 shows (2×2) memory cells MC as an example. The memory cell array 32 includes a plurality of pairs of bit lines BL and /BL running in the column direction. The memory cell array 32 also includes a plurality of word lines WL running in the row direction.

The memory cells MC are arranged at the intersections of the bit lines and word lines. Each memory cell MC includes the MTJ element 10 and a selection transistor 31. The selection transistor 31 is, e.g., an N-channel MOSFET (Metal Oxide Semiconductor Field Effect Transistor). One terminal of the MTJ element 10 is connected to the bit line BL. The other terminal of the MTJ element 10 is connected to the drain of the selection transistor 31. The gate of the selection transistor 31 is connected to the word line WL. The source of the selection transistor 31 is connected to the bit line /BL.

A row decoder 33 is connected to the word lines WL. The row decoder 33 selects one of the plurality of word lines WL based on a row address.

A write circuit 36 and read circuit 37 are connected to the pairs of bit lines BL and /BL via a column selector 35. The column selector 35 includes, e.g., N-channel MOSFETs equal in number to all the bit lines, and selects a pair of bit lines BL and /BL necessary for an operation in accordance with an instruction from a column decoder 34. The column decoder 34 decodes a column address, and supplies the decoded signal to the column selector 35.

The write circuit 36 receives externally supplied write data. The write circuit 36 applies a write voltage to a pair of bit lines BL and /BL connected to a selected memory cell as a write target. The write circuit 36 then writes the data in the selected memory cell by supplying a write current to the selected memory cell.

The read circuit 37 applies a read voltage to a selected memory cell as a read target. Then, the read circuit 37 detects data stored in the selected memory cell based on a read current flowing through the selected memory cell. The data read by the read circuit 37 is output outside.

Data write to the memory cell MC is performed as follows. First, to select the memory cell MC as a data write target, the row decoder 33 activates the word line WL connected to the selected memory cell MC. This turns on the selection transistor 31. In addition, the column decoder 34 selects the pair of bit lines BL and /BL connected to the selected memory cell MC.

In this state, one of bidirectional write currents is supplied to the MTJ element 10 in accordance with write data. More specifically, when supplying the write current to the MTJ element 10 from the left to the right in FIG. 5, the write circuit 36 applies a positive voltage to the bit line BL and the ground voltage to the bit line /BL. When supplying the write current to the MTJ element 10 from the right to the left in FIG. 5, the write circuit 36 applies a positive voltage to the bit line /BL and the ground voltage to the bit line BL. Consequently, data "0" or "1" can be written in the memory cell MC.

Data read from the memory cell MC is performed as follows. First, the selection transistor 31 of the selected memory cell MC is turned on in the same manner as in data write. The read circuit 37 supplies a read current flowing, e.g., from the right to the left in FIG. 5 to the MTJ element 10. This read current is set at a value much smaller than the threshold value of magnetization reversal caused by spin-transfer torque. Then, the read circuit 37 detects the resistance value of the MTJ element 10 based on the read current. Consequently, data stored in the MTJ element 10 can be read.

Figure 6:
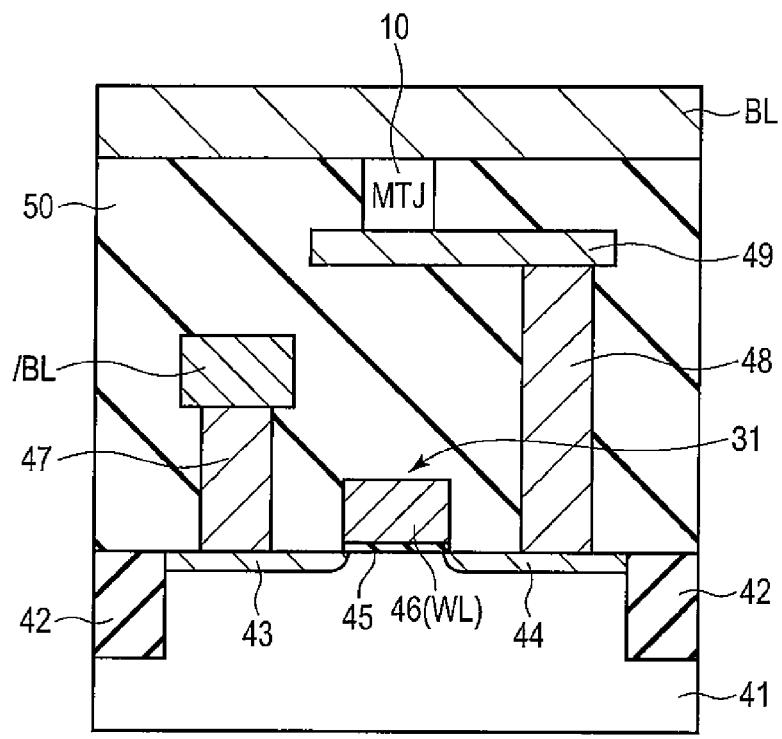
FIG. 6 is a sectional view showing the arrangement of the MRAM.

Next, a structure example of the MRAM 30 will be explained. FIG. 6 is a sectional view showing the arrangement of the MRAM 30. An element isolation insulating layer 42 having an STI (Shallow Trench Isolation) structure is formed in a P-type semiconductor substrate 41. An N-channel MOSFET as the selection transistor 31 is formed in an element region (active area) surrounded by the element isolation insulating layer 42. The selection transistor 31 includes a source region 43 and drain region 44 formed apart from each other in the element region, a gate insulating film 45 formed on a channel region between the source region 43 and drain region 44, and a gate electrode 46 formed on the gate insulating film 45. The gate electrode 46 corresponds to the word line WL shown in FIG. 5. Each of the source region 43 and drain region 44 is an N-type diffusion region.

A contact plug 47 is formed on the source region 43. The bit line /BL is formed on the contact plug 47. A contact plug 48 is formed on the drain region 44. An extraction electrode 49 is formed on the contact plug 48. The MTJ element 10 is formed on the extraction electrode 49. The bit line BL is formed on the MTJ element 10. An interlayer dielectric layer 50 fills the portion between the semiconductor substrate 41 and bit line BL.

In the third embodiment as described in detail above, the MRAM 30 can be formed by using either of the MTJ elements 10 explained in the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory element comprising:
   a memory layer having magnetic anisotropy perpendicular to a film surface and having a variable magnetization direction;
   a first nonmagnetic layer provided on the memory layer;
   a reference layer provided on the first nonmagnetic layer, having magnetic anisotropy perpendicular to a film surface, and having an invariable magnetization direction;
   a second nonmagnetic layer provided on the reference layer; and
   an adjustment layer provided on the second nonmagnetic layer and configured to reduce a leakage magnetic field from the reference layer,
   wherein the adjustment layer is formed by stacking an interface layer provided on the second nonmagnetic layer, and a magnetic layer having magnetic anisotropy perpendicular to a film surface, and
   saturation magnetization of the interface layer is larger than that of the magnetic layer.

2. The element of claim 1, wherein a magnetization direction in the interface layer is an in-plane direction.

3. The element of claim 1, wherein the interface layer is made of one element selected from the group consisting of Co, Fe, and Ni, or an alloy containing at least one element selected from the group consisting of Co, Fe, and Ni.

4. The element of claim 1, wherein the magnetic layer is made of an alloy containing at least one element selected from the group consisting of Co and Fe, and at least one element selected from the group consisting of Pt, Pd, and Cr.

5. The element of claim 1, wherein the magnetic layer is formed by alternately stacking an alloy containing at least one element selected from the group consisting of Co and Fe, and an alloy containing at least one element selected from the group consisting of Pt, Pd, and Cr.

6. The element of claim 1, wherein a magnetization direction in the magnetic layer is antiparallel to that in the reference layer.

7. A magnetic memory comprising a magnetic memory element of claim 1.

8. The memory of claim 7, further comprising:
   a first bit line electrically connected to one terminal of the magnetic memory element;

a selection transistor electrically connected to the other terminal of the magnetic memory element;
a second bit line electrically connected to one terminal of the selection transistor; and
a word line electrically connected to a gate of the selection transistor.

9. A magnetic memory element comprising:
a memory layer having magnetic anisotropy perpendicular to a film surface and having a variable magnetization direction;
a first nonmagnetic layer provided on the memory layer;
a reference layer provided on the first nonmagnetic layer, having magnetic anisotropy perpendicular to a film surface, and having an invariable magnetization direction;
a second nonmagnetic layer provided on the reference layer;
a first adjustment layer provided on the second nonmagnetic layer and configured to reduce a leakage magnetic field from the reference layer;
a third nonmagnetic layer provided under the memory layer; and
a second adjustment layer provided under the third nonmagnetic layer and configured to reduce the leakage magnetic field from the reference layer,
wherein the first adjustment layer is formed by stacking a first interface layer provided on the second nonmagnetic layer, and a first magnetic layer having magnetic anisotropy perpendicular to a film surface,
saturation magnetization of the first interface layer is larger than that of the first magnetic layer,
the second adjustment layer is formed by stacking a second interface layer provided on the third nonmagnetic layer, and a second magnetic layer having magnetic anisotropy perpendicular to a film surface, and
saturation magnetization of the second interface layer is larger than that of the second magnetic layer.

10. The element of claim 9, wherein a magnetization direction in each of the first interface layer and the second interface layer is an in-plane direction.

11. The element of claim 9, wherein each of the first interface layer and the second interface layer is made of one element selected from the group consisting of Co, Fe, and Ni, or an alloy containing at least one element selected from the group consisting of Co, Fe, and Ni.

12. The element of claim 9, wherein each of the first magnetic layer and the second magnetic layer is made of an alloy containing at least one element selected from the group consisting of Co and Fe, and at least one element selected from the group consisting of Pt, Pd, and Cr.

13. The element of claim 9, wherein each of the first magnetic layer and the second magnetic layer is formed by alternately stacking an alloy containing at least one element selected from the group consisting of Co and Fe, and an alloy containing at least one element selected from the group consisting of Pt, Pd, and Cr.

14. The element of claim 9, wherein a magnetization direction in each of the first magnetic layer and the second magnetic layer is antiparallel to that in the reference layer.

15. A magnetic memory comprising a magnetic memory element of claim 9.

16. The memory of claim 15, further comprising:
a first bit line electrically connected to one terminal of the magnetic memory element;
a selection transistor electrically connected to the other terminal of the magnetic memory element;
a second bit line electrically connected to one terminal of the selection transistor; and
a word line electrically connected to a gate of the selection transistor.

* * * * *